United States Patent [19]
Rösch et al.

[11] Patent Number: 5,840,363
[45] Date of Patent: Nov. 24, 1998

[54] PROCESS FOR THROUGHPLATING PRINTED CIRCUIT BOARDS USING CONDUCTIVE PLASTICS

[75] Inventors: Gerhard Rösch, Nürnberg; Walter Stuckmann, Altdorf, both of Germany

[73] Assignee: Grundig AG, Fuerth, Germany

[21] Appl. No.: 827,594

[22] Filed: Mar. 28, 1997

Related U.S. Application Data

[63] Continuation of Ser. No. 535,122, Oct. 27, 1995, abandoned.

[30] Foreign Application Priority Data

Apr. 30, 1993 [DE] Germany ............... 43 14 259.1

[51] Int. Cl.$^6$ ..................................... B05D 5/12
[52] U.S. Cl. .................. 427/97; 427/98; 427/306; 427/337; 427/340
[58] Field of Search .................. 427/96, 97, 98, 427/331, 337, 340, 304, 305, 306

[56] References Cited

U.S. PATENT DOCUMENTS

| | | | |
|---|---|---|---|
| 4,790,912 | 12/1988 | Holtzman et al. | 204/15 |
| 5,183,552 | 2/1993 | Bressel et al. | 205/158 |
| 5,194,313 | 3/1993 | Hupe et al. | 428/137 |
| 5,223,037 | 6/1993 | Kraiss et al. | 118/411 |
| 5,373,629 | 12/1994 | Hupe et al. | 29/852 |

FOREIGN PATENT DOCUMENTS

| | | | |
|---|---|---|---|
| 0348795 | 1/1990 | European Pat. Off. | |
| 0417750 | 3/1991 | European Pat. Off. | H05K 3/10 |
| 2649126 | 1/1991 | France . | |
| 3806884 | 9/1989 | Germany | H05K 3/42 |
| 3928832 | 3/1991 | Germany | H05K 3/42 |
| 3935831 | 5/1991 | Germany | H05K 3/42 |
| 8908375 | 9/1989 | WIPO . | |

OTHER PUBLICATIONS

Blasberg–Mitteilungen No. 11, Nov. 1991, "DMS 2, the break through".

*Primary Examiner*—Benjamin Utech
*Assistant Examiner*—Brian K. Talbot
*Attorney, Agent, or Firm*—Paul J. Vincent

[57] ABSTRACT

The invention pertains to a process for throughplating of printed circuit boards using conductive plastics for direct plating, wherein a polymer film with intrinsic electric conductivity is adhesively deposited on non-conductive areas of the printed circuit boards, whereupon a metal film is applied. Selective production of the polymer film has previously been seen as requiring an oxidative pre-treatment of the printed circuit board, though this can negatively affect the further course of the process. With the present invention the potential negative effects are avoided by forgoing the oxidation pre-treatment.

13 Claims, No Drawings

PROCESS FOR THROUGHPLATING PRINTED CIRCUIT BOARDS USING CONDUCTIVE PLASTICS

This application is a continuation, of application Ser. No. 08/535,122, filed Oct. 27, 1995, now abandoned.

BACKGROUND OF THE INVENTION

The invention concerns a method for the throughplating of printed circuit boards using conductive plastics for direct plating with which a polymer layer having intrinsic electrical conductivity is bonded to non-conducting locations of the printed circuit board, whereupon a metal layer is deposited.

Throughplated printed circuit boards have been, up to this point, produced largely by means of chemical metallic deposition on catalytically activated surfaces of a substrate material. The metallic layers, deposited without external current, are, if appropriate strengthened by galvanic metallic deposition. This technology allows for the production of high quality printed circuit boards. The catalytic activation is normally effected by means of precious-metal-containing, colloidal, ionogenic or non-ionogenic catalyzers, in particular based on palladium and tin. Non-precious metal containing systems based on copper are also known in the art.

The conventional technology has the disadvantage that even small deviations from the prescribed processing parameters lead to a defective plating. Furthermore, the high price of precious metal containing catalyzer systems and the substantial waste water pollution caused by the utilization of formaldehyde and complexing agents are further disadvantages of this conventional and widely used technology.

In order to avoid these disadvantages, a new technology has been developed based on the utilization of electrically conducting polymers. The new technology has the additional advantage of having achieved a reduction in processing steps while maintaining high quality plating.

The drilled metal-clad printed circuit boards comprising fiber glass reinforced epoxy resins are subjected to the following processing stages:

1. Mechanical cleaning
2. Washing
3. Etching
4. Washing
5. Conditioning
6. Washing
7. Oxidative pre-treatment
8. Washing
9. Catalyzation
10. Activation
11. Washing
12. Conventional further processing The mechanical cleaning can, for example, include burr removal by means of brushing, ultrasonic cleaning and the like. The printed circuit boards are etched for further cleaning. Conditioning then follows by means of which an improved wettability of the surface is achieved. In the oxidative pre-treatment, a manganese dioxide ($MnO_2$) layer is deposited on the non-metal-clad surfaces of the printed circuit board, in particular the drill-hole walls through oxidation of epoxy resin components using a $KMnO_4$ solution at high temperatures (70°–90° C.). The printed circuit board is completely wet during catalyzation with a watery solution which contains monomers (heterocyclic organic compounds, mostly pyrrole). Following the catalyzation, the printed circuit boards are subjected to activation to form a conducting polypyrrole layer. Towards this end, the printed circuit boards are dipped in an acidic watery solution. By means of an acidic catalyzing oxidating polymerization reaction, the conducting polymer layer is selectively built-up at those locations where magnesium dioxide was deposited in the oxidating pre-treatment, whereby the magnesium dioxide serves the purpose of an oxidation medium. The conventional construction of the conducting path structures, for example, using galvanic copper deposition then follows. The printed circuit board is washed between all working stages; washing occurs except following the catalyzation.

The above briefly described procedure for throughplating printed circuit boards is known in the art and is precisely described, by way of example, in the patent documents DE 38 06 884 C1, DE 39 28 832 A1 and EP 0 417 750 A2. Additional information can be derived from the journal Blasberg-Mitteilungen, Nr. 11, November 1991, "DMS2, Der Durchbruch" ["DMS2, The Breakthrough" Blasberg-Communications, No. 11, November 1991]. All the documents mentioned in this paragraph are hereby incorporated by reference into the instant application.

The new printed circuit board throughplating technology has, however, problems with the throughplating when the formation of the manganese dioxide layer on the non-conducting locations of the printed circuit board is disrupted. Both the deposition of too much as well as of too little manganese dioxide negatively influences the creation of the conducting polymer layer. Particular difficulties with the formation of the manganese oxide layer furthermore result when instead of high quality and expensive printed circuit board substrate materials such as fiberglass reinforced epoxy resin (FR4), less expensive substrate materials such as phenolic resin-laminated paper (FR2), epoxy resin paper (FR3) or epoxy resin paper with fiber glass reinforced outer layer (CEM) are utilized. Problems utilizing these materials result from the oxidative pre-treatment of the printed circuit boards with which the inner paper layers and the acrylic bonding agent of the less expensive substrate materials are attacked, as result of which the laying-down of the manganese dioxide layer, which is important for the polymerization, is substantially degraded and defects occur during galvanizing plating.

Also known in the art from for example, patent application EP-0 348 795 A2 is the production of composite materials comprising a substrate material and an electrically conducting polymer film. Towards this end the substrate material is initially brought into contact with a monomer solution and, subsequently with a watery oxidation medium solution or vice versa. Towards this end, as known in the art from FR 2 649 126 A1, the watery solution containing the oxidating means can be stirred during the oxidation process so that the watery solution exhibits flow relative to the substrate material.

However, in this conventional method, a polymer film securely bonded over the entire surface of the substrate results. The selective deposition of a polymer layer only on the non-conducting surfaces of a substrate consisting of conducting and non-conducting materials is, in accordance with the conventional method, not possible. Neither are the special problems of printed circuit boards throughplating holes treated.

It is therefore the purpose of the present invention to further develop the known method for throughplating of printed circuit boards using conducting plastics for direct plating in such a fashion that the problems which result from the oxidative pre-treatment are eliminated. Simultaneously one should thereby further guarantee that the selective deposition of the conducting polymer layer only occurs on non-conducting surfaces, in particular the surfaces of the throughplating holes.

SUMMARY OF THE INVENTION

This purpose is achieved in accordance with the invention in that the polymer layer is directly deposited on the substrate material of the printed circuit board. This is possible while omitting the oxidative pre-treatment, since a large adsorptivity is present in particular in the throughplating holes due to the roughness resulting from the drilling. This adsorptivity allows for good reception of the solution containing the monomer. The acidic catalyzing oxidative polymerization reaction is initiated by means of an acidic watery solution flowing relative to the printed circuit boards. The acidic solution additionally contains an oxidation means for this purpose. A bonded polymer layer forms in the rough throughplating holes. The polymer layer resulting on the smooth metal-clad surfaces of the printed circuit board is not firmly bonded due to the flow velocity of the catalyzing solution and is therefore more easily removed without residue.

The advantage of the method in accordance with the invention is, in particular, that, in contrast to the conventional method, the oxidative pre-treatment which had up to this point been considered to be essential for a selective polymer layer build-up on only the non-conducting surfaces, can be omitted. This facilitates the utilization of less expensive substrate materials for the printed circuit boards. In addition to the cost savings which thereby result there is a further environmental advantage, since the method step involving manganese dioxide formation can be eliminated.

The throughplating can be carried out in a rapid and reliable fashion by means of horizontal processing technology.

Two method steps can be advantageously unified through the utilization of the same solution for both activating the polymerization as well as for the removal of the polymer forming on the conducting surfaces.

It is particularly advantageous when the throughplating holes are produced in accordance with the invention not only by drilling, but also by punching. This is possible, since even extremely rough and torn throughplating hole walls can be reliably and completely covered with a polymer layer. In this fashion it is possible to save considerable sums, since with large printed circuit board production volumes, the punching of the throughplating holes is substantially more economical to carry out than is drilling.

Further advantageous embodiments of the method in accordance with the invention can be derived from the remaining dependent claims. In particular a method in accordance with the invention is advantageous when printed circuit boards from FR4 substrate material as well as printed circuit boards from the less expensive materials FR2, FR3 and CEM, which can be reliably throughplated, are utilized.

The process steps of the method in accordance with the invention will be more closely described below. One will thereby assume that the method is carried out using horizontal processing technology, since in particular in the horizontal processing method, the short and well defined treatment times which are necessary for the production of a conducting polymer layer can be achieved.

DESCRIPTION OF THE PREFERRED EMBODIMENT

The metal-clad printed circuit boards provided with the throughplating holes are subjected to the following method steps:

1. Mechanical cleaning
2. Washing
3. Etching
4. Washing
5. Conditioning
6. Washing
7. Catalyzation
8. Activation
9. Washing
10. Conventional further processing The method steps 1 through 6 correspond to the above described first six working stages of the conventional method and are thoroughly described in the documents cited.

The roughness of the hole walls gives the non-conducting locations a good adsorptivity, as a result of which it is possible to adsorb a quantity of monomer solution sufficient for a closed polymer layer. For this reason, in the method in accordance with the invention, the throughplated holes can be drilled as well as punched or stamped, since even very rough and torn hole walls can be reliably covered with a polymer layer. The adsorptivity is increased even more through the utilization of paper-containing substrate materials (FR2, FR3 or CEM).

A watery monomer solution containing heterocyclic organic compounds, for example pyrrole is utilized for the purpose of catalyzing in accordance with method step 7. In addition to pyrrole (1–20% by volume), the solution contains an organic solvent (50–99% by volume). The remaining portion is water. The pH-value of the solution lies preferentially between 7 and 12. Particularly good results are given when a fraction of 8 to 12% by volume Pyrrole is contained in the solution. The treatment time assumes a value of 0.2–20 minutes, and the temperature preferentially 15°–20° C.

The printed circuit boards are completely wet with the described solution by immersion or overflow with a standing wave.

In subsequent method step 8, activation towards formation of the polypyrrole conducting layer takes place. An acid-catalyzed oxidative polymerization reaction is initiated by means of an acidic watery solution which additionally contains an oxidation means. The solution contains, in addition to a fraction of 1–20% by weight acid, such as hydrochloric, sulfuric or phosphoric acid or the like, a fraction of 2–10% by weight $H_2O_2$, or 1–20% by weight alkalipersulfate (for example sodium persulfate), and the remaining amount is water. The flow velocity which is present during the deposition as described below has the effect that the polymer formed is only loosely bonded to the smooth metallic surface as a result of which it is easily subsequently removed. The firm bonding of the polymer to the metallic surface is furthermore prevented through the etching of the metal layer via the acidic component of the solution as well by means of the alkalipersulfate present in the solution.

In contrast thereto the monomer adsorbed in the non-conducting locations of the printed circuit board forms a securely bonded polymer layer at these locations during the polymerization.

The handling time assumes a value of 10 seconds to 2 minutes, the temperature 20°–50° C., whereby particularly good results can be achieved at 30° C.

Through the utilization of horizontal processing technology, the activating solution can be most advantageously introduced by means of soaking through a standing wave. Following this overflowing of the printed circuit boards, the polymer layers which loosely bond to the printed circuit board surface can be removed by spraying. Particularly advantageous is the utilization of the activating solution, as a result of which a defined and complete polymerization of the adsorbed monomer is achieved.

The removability of the polymer layer from the metallic surfaces is improved even more when the printed circuit boards are sprayed with the activating solution prior to soaking.

In method step 9, the polymer layer residue and the activating solution are removed from conducting locations by means of washing with water.

The conventional further processing steps then follow in order to strengthen the throughplating or to produce the desired conducting paths. This can take place galvanically or without external current.

Copper, nickel, gold, palladium, tin, lead or tin/lead are particularly suitable for plating or metal-cladding.

In principal all conventional methods such as subtractive, semiadditive and additive techniques are possible. These methods are, for example, described in more detail in the above mentioned documents.

As shown by extensive experimentation, it is necessary to change various method steps in order to achieve optimum results. A point of departure is given therein that, for example, the copper electrolyte for galvanic plating must be adapted to the particular characteristics of the polypyrrole layer in the event that plating of the polypyrrole layer takes place subsequent to photoprocessing. The copper electrolytes which have been utilized in conventional printed circuit board technology up to this point lead, in contrast thereto, to a defective metallic deposition.

In the event that fiber glass reinforced substrate materials such as FR4 are utilized for the printed circuit boards instead of the paper containing basis materials (FR2, FR3, CEM), it has been shown to be advantageous to soak the non-conducting locations of the printed circuit board—in particular the throughplating holes—prior to the catalyzing method step. In this manner the adsorptivity of these substrate materials is improved, as result of which the adsorption of an increased quantity of catalyzing solution is possible. It is particularly advantageous to further processing when the same organic solvent is utilized for soaking which is also contained in the catalyzing solution.

In addition to the throughplating of printed circuit boards having two-sided conducting paths, the throughplating of printed circuit boards which have additional conducting paths in the inside (so called multilayer) is also possible. It has been shown that, with this type of printed circuit board, more stringent requirements on the cleaning of the throughplating holes are necessary. In particular one must prevent the inner-lying conducting paths, which must be electrically conductively connected by means of the plated throughplating holes, from being covered or soiled by substrate material when drilling the holes.

We claim:

1. A method for the throughplating of printed circuit boards using conductive plastics, wherein a polymer layer having intrinsic electrical conductivity is bonded to non-conducting locations of printed circuit boards, whereupon a metallic layer is deposited, said method comprising the steps of:

selecting a printed circuit board having a substrate material and metal-clad locations on both sides;

directly depositing the polymer layer on said substrate material without prior oxidative pre-treatment thereof by wetting an entire surface of the selected printed circuit board, the surface defining throughplating holes, with a monomer solution comprising a monomer for forming a polymer, the monomer being adsorbed into the surface defining the throughplating holes;

polymerizing the monomer using an acidic solution comprising water and an acidic oxidizing substance, the acidic solution having a flow velocity relative to the surface to inhibit bonding of the polymer layer to said metal-clad locations; and removing polymer bonded during the polymerizing step to the metal-clad locations of the selected circuit board.

2. The method of claim 1, further comprising the step of positioning the printed circuit board horizontally prior to processing.

3. The method of claim 1, wherein the flow velocity of the acidic solution used in the polymerizing step removes polymer bonded to the metal-clad locations.

4. The method of claim 1, further comprising producing the throughplating holes by stamping or drilling.

5. The method of claim 1, wherein the metallic layer is selected from the group consisting of copper, nickel, gold, palladium, tin, lead, and tin/lead.

6. The method of claim 1, wherein the monomer solution used in the wetting step comprises a monomer, an organic solvent and water.

7. The method of claim 6, wherein the monomer solution contains 1 to 20% by volume monomer, 50 to 99% by volume organic solvent or water or 50 to 99% by volume of a mixture of organic solvent and water.

8. The method of claim 1, wherein the monomer is pyrrole.

9. The method of claim 1, wherein the acidic solution comprises 1 to 20% by weight of an acid selected from the group consisting of sulfuric acid, hydrochloric acid, and phosphoric acid, 1 to 20% weight alkalipersulfate, and the rest water.

10. The method of claim 1, wherein the acidic solution comprises 1 to 20% by weight of an acid selected from the group consisting of sulfuric acid, hydrochloric acid and phosphoric acid, 1 to 20% by weight alkalipersulfate, 2 to 10% by weight $H_2O_2$, and the rest water.

11. The method according to claim 1, wherein the acidic solution comprises 1 to 20% by weight of an acid selected from the group consisting of sulfuric acid, hydrochloric acid and phosphoric acid, 2 to 10% by weight $H_2O_2$, and the rest water.

12. The method of claim 1, wherein the selecting step comprises printed circuit boards having a paper-containing substrate material.

13. The method of claim 1, wherein the selecting step comprises printed circuit boards having fiber glass reinforced substrate materials and the non-conducting locations are soaked by means of an organic solvent prior to the wetting step.

* * * * *